(12) United States Patent
Ogata

(10) Patent No.: US 12,519,448 B2
(45) Date of Patent: Jan. 6, 2026

(54) FILTER APPARATUS

(71) Applicant: Murata Manufacturing Co., Ltd., Nagaokakyo (JP)

(72) Inventor: Makoto Ogata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 114 days.

(21) Appl. No.: 18/429,513

(22) Filed: Feb. 1, 2024

(65) Prior Publication Data

US 2024/0275353 A1 Aug. 15, 2024

(30) Foreign Application Priority Data

Feb. 10, 2023 (JP) .................. 2023-019123

(51) Int. Cl.
| | | |
|---|---|---|
| *H03H 7/01* | (2006.01) | |
| *H01F 17/00* | (2006.01) | |
| *H01G 4/30* | (2006.01) | |
| *H03H 1/00* | (2006.01) | |
| *H03H 7/09* | (2006.01) | |

(52) U.S. Cl.
CPC ....... *H03H 7/0115* (2013.01); *H01F 17/0013* (2013.01); *H01G 4/30* (2013.01); *H03H 7/09* (2013.01); *H01F 2017/0026* (2013.01); *H03H 2001/0085* (2013.01)

(58) Field of Classification Search
CPC ......... H03H 2001/0085; H03H 7/0115; H03H 7/09; H01G 4/30
USPC ...................... 333/175, 177, 185
See application file for complete search history.

(56) References Cited

U.S. PATENT DOCUMENTS 8,680,950 B2 * 3/2014 Taniguchi ............. H03H 7/09
333/185
2023/0044655 A1 2/2023 Ogata et al.

FOREIGN PATENT DOCUMENTS

JP 2022-77784 A 5/2022
WO 2022019112 A1 1/2022

* cited by examiner

*Primary Examiner* — Rakesh B Patel
(74) *Attorney, Agent, or Firm* — Keating & Bennett, LLP

(57) ABSTRACT

A filter apparatus includes first to third resonators magnetically coupled and located in a signal transmission path from an input terminal to an output terminal. Each of the resonators includes a capacitor electrode and an inductor path. The capacitor and a ground electrode define a capacitor. The inductor path connects the capacitor and ground electrodes. The inductor path in the second resonator includes first and second lines electrically connected in parallel, between the capacitor electrode of the second resonator and the ground electrode. A first interconnection pattern connects the inductor path in the first resonator and the first line. A third interconnection pattern connects the inductor path in the third resonator and the second line. A second interconnection pattern connects the first and second lines at a position different from a position of connection of the first interconnection pattern in the first line.

20 Claims, 8 Drawing Sheets

FILTER APPARATUS

CROSS REFERENCE TO RELATED APPLICATIONS

This nonprovisional application is based on Japanese Patent Application No. 2023-019123 filed with the Japan Patent Office on Feb. 10, 2023, the entire contents of which are hereby incorporated by reference.

BACKGROUND OF THE INVENTION

1. Field of the Invention

The present disclosure relates to filter apparatuses and more specifically to techniques to improve attenuation characteristics in a non-pass band in band pass filters.

2. Description of the Related Art

Japanese Patent Laid-Open No. 2022-77784 discloses a diplexer in which two filter circuits different in pass band from each other are included in a multilayer body where a plurality of insulator layers are layered. The filter circuit on a high band side of the diplexer described in Japanese Patent Laid-Open No. 2022-77784 includes a plurality of resonators magnetically coupled to one another.

SUMMARY OF THE INVENTION

In the filter circuit on the high band side disclosed in Japanese Patent Laid-Open No. 2022-77784, three resonators are connected to one another by a common plate electrode. According to this configuration, a degree of magnetic coupling among the resonators is enhanced. With a higher degree of magnetic coupling, an attenuation pole generated by the resonators can be closer to the pass band, and therefore steepness of attenuation at an end of the pass band can be increased. With the higher degree of magnetic coupling, on the other hand, an amount of attenuation (attenuation depth) at the attenuation pole is smaller and a desired amount of attenuation may not be ensured in a non-pass band. Therefore, depending on specifications required of the filter circuit, the configuration in which the resonators are connected by the common plate electrode as in Japanese Patent Laid-Open No. 2022-77784 may not be able to achieve desired filter characteristics.

Example embodiments of the present invention improve attenuation characteristics in non-pass bands in filter apparatuses each including a plurality of resonators.

A filter apparatus according to one aspect of an example embodiment of the present disclosure includes a multilayer body including a plurality of dielectric layers, an input terminal, an output terminal, and a ground terminal in the multilayer body, a ground electrode connected to the ground terminal, first to third resonators, and first to third interconnection patterns. The first to third resonators are magnetically coupled to one another inside of the multilayer body and located in a signal transmission path from the input terminal to the output terminal. Each of the first to third resonators includes a capacitor electrode and an inductor path. The capacitor electrode is opposed to the ground electrode, and defines a capacitor together with the ground electrode. The inductor path connects the capacitor electrode and the ground electrode to each other. The inductor path in the second resonator includes a first line and a second line electrically connected in parallel, between the capacitor electrode of the second resonator and the ground electrode. The first interconnection pattern connects the inductor path in the first resonator and the first line to each other. The third interconnection pattern connects the inductor path in the third resonator and the second line to each other. The second interconnection pattern connects the first line and the second line to each other at a position different from a position of connection of the first interconnection pattern in the first line.

A filter apparatus according to another aspect of an example embodiment of the present disclosure includes a multilayer body including a plurality of dielectric layers, an input terminal, an output terminal, and a ground terminal in the multilayer body, a ground electrode connected to the ground terminal, first to fourth resonators, and first to fifth interconnection patterns. The first to fourth resonators are magnetically coupled to one another inside of the multilayer body and located in a signal transmission path from the input terminal to the output terminal. Each of the first to fourth resonators includes a capacitor electrode and an inductor path. The capacitor electrode is opposed to the ground electrode, and defines a capacitor together with the ground electrode. The inductor path connects the capacitor electrode and the ground electrode to each other. The inductor path in the second resonator includes a first line and a second line electrically connected in parallel, between the capacitor electrode of the second resonator and the ground electrode. The inductor path in the third resonator includes a fourth line and a fifth line electrically connected in parallel, between the capacitor electrode of the third resonator and the ground electrode. The first interconnection pattern connects the inductor path in the first resonator and the first line to each other. The second interconnection pattern connects the first line and the second line to each other. The third interconnection pattern connects the second line and the fifth line to each other. The fourth interconnection pattern connects the inductor path in the fourth resonator and the fourth line to each other. The fifth interconnection pattern connects the fourth line and the fifth line to each other. The second interconnection pattern connects the first line and the second line to each other at a position on the first line different from the first interconnection pattern. The fifth interconnection pattern connects the fourth line and the fifth line to each other at a position on the fourth line different from the fourth interconnection pattern.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
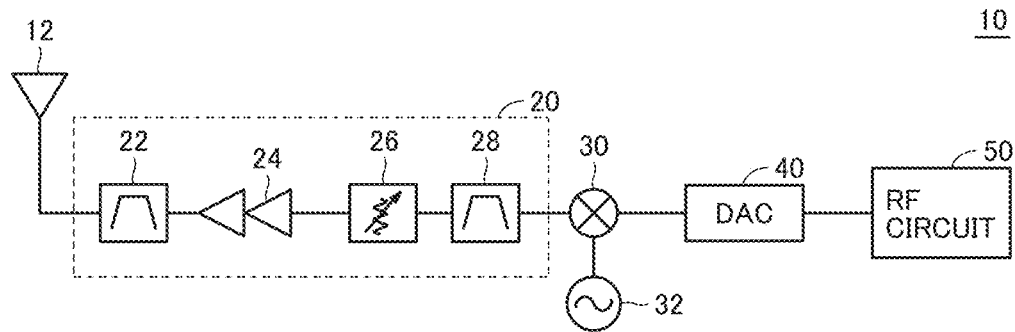
FIG. 1 is a block diagram of a communication apparatus including a radio-frequency front end circuit to which a filter apparatus in a first example embodiment of the present invention is applied.

Example embodiments of the present disclosure will be described in detail below with reference to the drawings. The same or corresponding elements in the drawings have the same reference characters allotted and description thereof will not be repeated.

First Example Embodiment (Basic Configuration of Communication Apparatus)

FIG. 1 is a block diagram of a communication apparatus 10 including a radio-frequency front end circuit 20 to which a filter apparatus 100 in a first example embodiment is applied. Communication apparatus 10 is, for example, a portable terminal represented by a smartphone or a cellular base station.

Referring to FIG. 1, communication apparatus 10 includes an antenna 12, radio-frequency front end circuit 20, a mixer 30, a local oscillator 32, a D/A converter (DAC) 40, and an RF circuit 50. Radio-frequency front end circuit 20 includes band pass filters 22 and 28, an amplifier, 24, and an attenuator 26. Though FIG. 1 illustrates an example in which radio-frequency front end circuit 20 includes a transmission circuit to transmit a radio-frequency signal from antenna 12, radio-frequency front end circuit 20 may include a reception circuit to receive a radio-frequency signal through antenna 12.

Communication apparatus 10 up-converts a transmission signal transmitted from RF circuit 50 to a radio-frequency signal and radiates the radio-frequency signal from antenna 12. A modulated digital signal which is the transmission signal outputted from RF circuit 50 is converted to an analog signal by D/A converter 40. Mixer 30 mixes the transmission signal converted from the digital signal to the analog signal by D/A converter 40 with an oscillation signal from local oscillator 32 to up-convert the transmission signal to a radio-frequency signal. Band pass filter 28 removes spurious waves caused by up-conversion to extract only the transmission signal in a desired frequency band. Attenuator 26 adjusts an intensity of the transmission signal. Amplifier 24 amplifies a power of the transmission signal that has passed through attenuator 26 to a prescribed level. Band pass filter 22 removes spurious waves caused in an amplification process and allows passage only of a signal component in a frequency band defined under communication standards. The transmission signal that has passed through band pass filter 22 is radiated from antenna 12.

Filter apparatuses according to example embodiments of the present disclosure can be adopted as band pass filters 22 and 28 in communication apparatus 10 as above.

(Configuration of Filter Apparatus)

Figure 2:
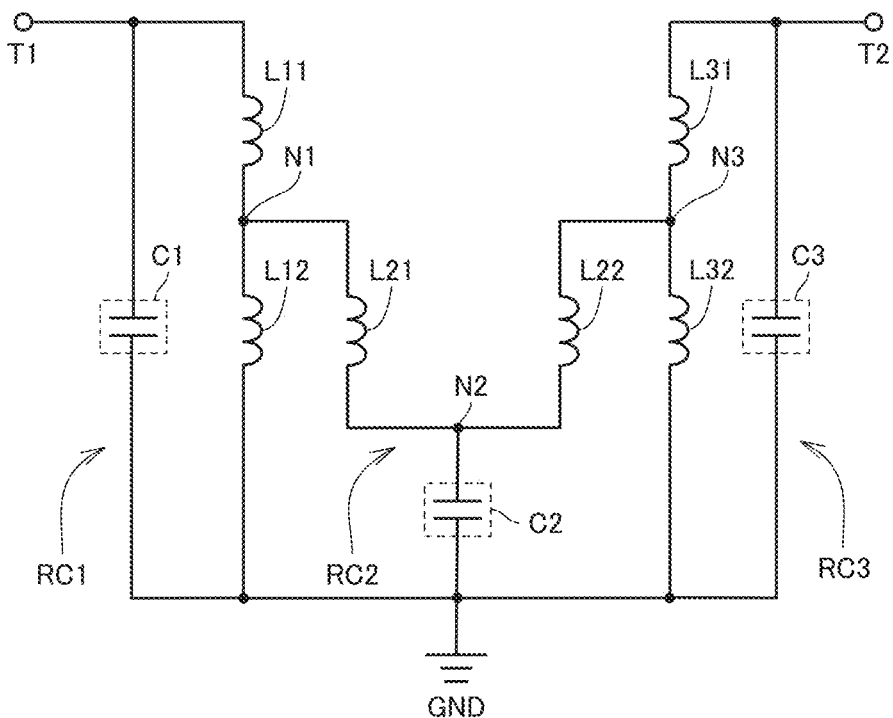
FIG. 2 is an equivalent circuit diagram of the filter apparatus in the first example embodiment of the present invention.

FIG. 2 is an equivalent circuit diagram of filter apparatus 100. Referring to FIG. 2, filter apparatus 100 includes an input terminal T1, an output terminal T2, a ground terminal GND, and resonators RC1 to RC3. Each of resonators RC1 to RC3 is an LC parallel resonator in which an inductor and a capacitor are connected in parallel.

Resonator RC1 includes inductors L11 and L12 connected in series between input terminal T1 and ground terminal GND, and a capacitor C1 connected in parallel to inductors L11 and L12.

Resonator RC3 includes inductors L31 and L32 connected in series between output terminal T2 and ground terminal GND and a capacitor C3 connected in parallel to inductors L31 and L32.

Resonator RC2 includes inductors L12, L21, L22, and L32 and a capacitor C2. Inductors L21 and L22 are connected in series between a connection node N1 and a connection node N3, connection node N1 being between inductor L11 and inductor L12, connection node N3 being between inductor L31 and inductor L32. Capacitor C2 is connected between a connection node N2 and ground terminal GND, connection node N2 being between inductor L21 and inductor L22. In other words, between connection node N2 and ground terminal GND, an inductor path including inductors L12, L21, L22, and L32 and capacitor C2 are connected in parallel to implement an LC parallel resonator.

Inductor L12 is shared between resonator RC1 and resonator RC2. Inductor L32 is shared between resonator RC2 and resonator RC3.

The resonators are coupled to one another by magnetic coupling. Filter apparatus 100 has a configuration in which resonators in three stages magnetically coupled to one another are arranged between input terminal T1 and output terminal T2. With adjustment of a resonance frequency of each resonator, filter apparatus 100 defines and functions as a band pass filter that allows passage of a signal in a desired frequency band.

As shown in the equivalent circuit in FIG. 2, resonator RC1 and resonator RC2 are directly connected to each other at connection node N1. Resonator RC2 and resonator RC3 are directly connected to each other at connection node N3. Resonator RC1 and resonator RC3 are connected to each other with inductors L21 and L22 in resonator RC2 being interposed. Therefore, a degree of magnetic coupling between resonator RC1 and resonator RC3 is weaker than the degree of coupling between resonator RC1 and resonator RC2 and the degree of coupling between resonator RC2 and resonator RC3.

"Resonators RC1 to RC3" in FIG. 2 are exemplary "first resonator" to "third resonator" in the present disclosure. "Resonator RC1" may be the "third resonator" and "resonator RC3" may be the "first resonator." A path through "inductors L12 and L21" in resonator RC2 is an exemplary "first line" in the present disclosure and a path through "inductors L22 and L32" is an exemplary "second line" in the present disclosure.

Figure 3:
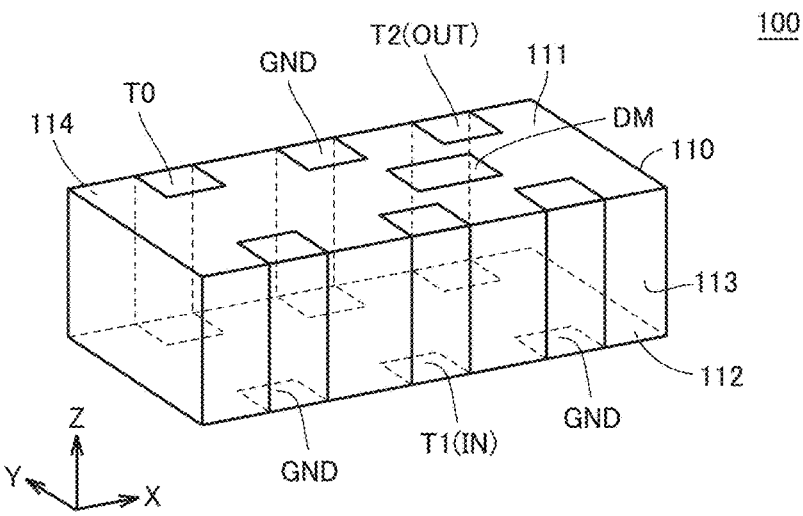
FIG. 3 is an external perspective view of the filter apparatus in the first example embodiment of the present invention.
Figure 4:
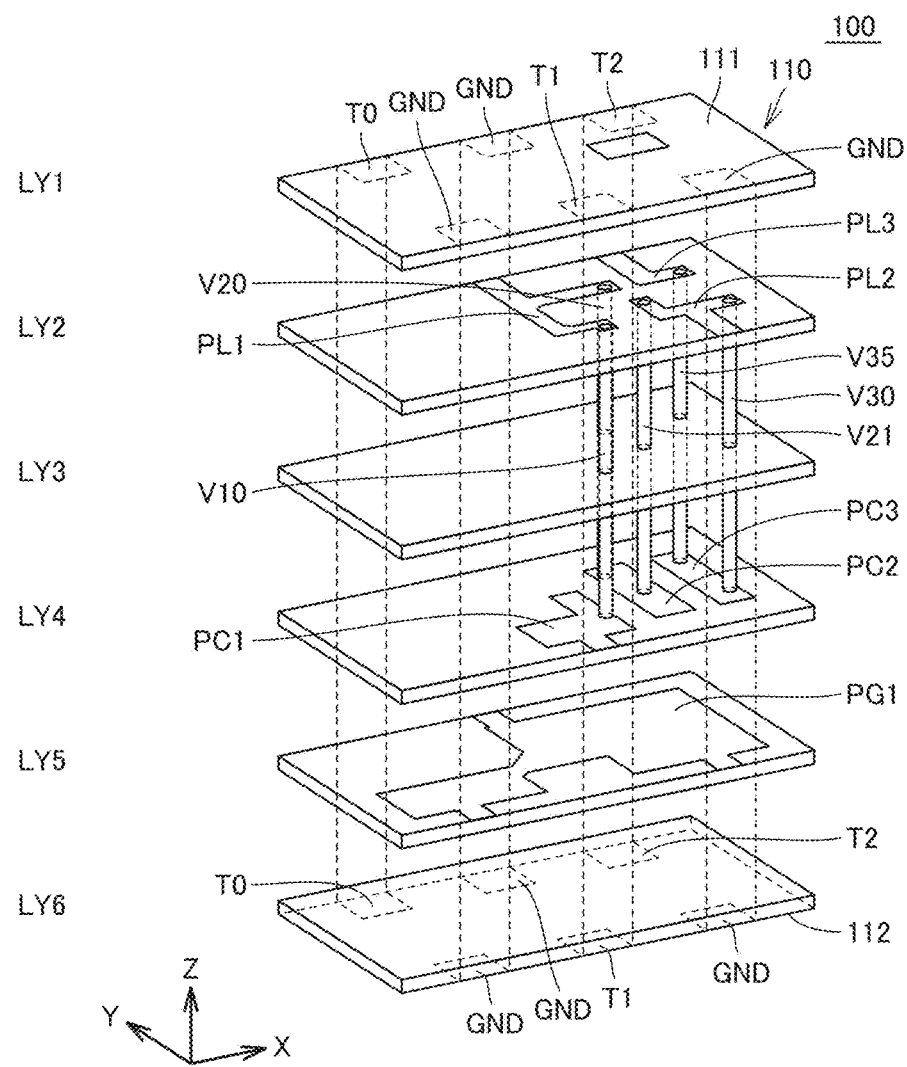
FIG. 4 is an exploded perspective view showing an exemplary multilayer structure of the filter apparatus in FIG. 3.

FIG. 3 is an external perspective view of filter apparatus 100 and FIG. 4 is an exploded perspective view showing an exemplary multilayer structure of filter apparatus 100.

Referring to FIGS. 3 and 4, filter apparatus 100 includes a multilayer body 110 in a shape of a cuboid or substantially cuboid, multilayer body 110 including a plurality of dielectric layers LY1 to LY6 layered in a layering direction. Dielectric layers LY1 to LY6 are made of a resin or ceramic such as low temperature co-fired ceramics (LTCC), for example. In the inside of multilayer body 110, the inductors and the capacitors of the LC parallel resonator are defined by a plurality of electrodes provided in the dielectric layers and a plurality of vias arranged between the dielectric layers. The "via" herein refers to a conductor provided in a dielectric layer for connection between electrodes provided in different dielectric layers. The via is formed, for example, from a conductive paste, plating, and/or a metallic pin.

In the description below, a layering direction of dielectric layers LY1 to LY6 in multilayer body 110 is defined as a "Z-axis direction," a direction along a long side of multilayer body 110 which is perpendicular to the Z-axis direction is defined as an "X-axis direction," and a direction along a short side of multilayer body 110 is defined as a "Y-axis direction." A positive direction along the Z axis in each figure may be referred to as an upper side and a negative direction may be referred to as a lower side below.

A directional mark DM is preferably provided on an upper surface 111 (dielectric layer LY1) of multilayer body 110 to specify a direction of filter apparatus 100. External terminals (input terminal T1, output terminal T2, and ground terminal GND) to connect between filter apparatus 100 and an external apparatus extend from upper surface 111 of multilayer body 110 through side surfaces 113 and 114 along a direction of a long side to a lower surface 112 (dielectric layer LY6). When viewed in a plan view from the X-axis direction, each of input terminal T1, output terminal T2, and ground terminal GND is an electrode in a shape of a flat plate, the electrode having a cross-section substantially in a C shape.

A terminal T0 is also arranged as an external terminal in multilayer body 110. Terminal T0 herein is a dummy terminal not connected to an internal circuit. When filter apparatus 100 is configured as a diplexer, however, terminal T0 may be used as an output terminal of another filter circuit. The external terminal may be a land grid array (LGA) terminal arranged on lower surface 112. In this case, each external terminal and another element in multilayer body 110 are connected to each other through a via provided in multilayer body 110.

As described with reference to FIG. 2, filter apparatus 100 includes resonators RC1 to RC3 which are LC parallel resonators. More specifically, resonator RC1 includes a via V10, a capacitor electrode PC1, and a plate electrode PL1. Resonator RC2 includes vias V20 and V21, a capacitor electrode PC2, and plate electrodes PL1 and PL2. Resonator RC3 includes a via V30, a capacitor electrode PC3, and plate electrode PL2.

In side surface 113, input terminal T1 is connected to capacitor electrode PC1 arranged in dielectric layer LY4. Capacitor electrode PC1 is substantially in an L shape when multilayer body 110 is viewed in the plan view from a normal direction (X-axis direction) and partially overlaps with a ground electrode PG1 arranged over a wide range of dielectric layer LY5. Ground electrode PG1 is connected to ground terminal GND in side surfaces 113 and 114. Capacitor C1 in FIG. 2 includes capacitor electrode PC1 and ground electrode PG1.

Capacitor electrode PC1 is connected, through via V10, to plate electrode PL1 arranged in dielectric layer LY2. In an example in FIG. 4, plate electrode PL1 is an electrode substantially in a deformed F shape including three ends. Plate electrode PL1 includes a first end connected to via V10. Plate electrode PL1 includes a second end connected to ground terminal GND in side surface 114. Via V10 and a path from the first end of plate electrode PL1 to ground terminal GND define the inductor path including inductors L11 and L12 in FIG. 2.

Plate electrode PL1 includes a third end connected to via V20. Via V20 connects plate electrode PL1 and capacitor electrode PC2 arranged in dielectric layer LY4 to each other. When multilayer body 110 is viewed in the plan view in the layering direction, a portion of capacitor electrode PC2 overlaps with ground electrode PG1 arranged in dielectric layer LY5. Capacitor C2 in FIG. 2 includes capacitor electrode PC2 and ground electrode PG1. Via V20 and a path from the third end of plate electrode PL1 to ground terminal GND define the inductor path including inductors L12 and L21 in FIG. 2.

A via V21 is further connected to capacitor electrode PC2. Via V21 is connected to plate electrode PL2 arranged in dielectric layer LY2. In the example in FIG. 4, plate electrode PL2 is an electrode substantially in a deformed Y shape including three ends. The electrode substantially in the Y shape has a first end connected to via V21. Plate electrode PL2 includes a second end connected to ground terminal GND in side surface 113. Via V21 and a path from the first end of plate electrode PL2 to ground terminal GND define the inductor path including inductors L22 and L32 in FIG. 2.

Plate electrode PL2 includes a third end connected to via V30. Via V30 connects plate electrode PL2 and capacitor electrode PC3 arranged in dielectric layer LY4 to each other.

When multilayer body 110 is viewed in the plan view in the layering direction, a portion of capacitor electrode PC3 overlaps with ground electrode PG1 arranged in dielectric layer LY5. Capacitor C3 in FIG. 2 includes capacitor electrode PC3 and ground electrode PG1. Via V30 and a path from the third end of plate electrode PL2 to ground terminal GND define an inductor path including inductors L31 and L32 in FIG. 2.

Capacitor electrode PC3 is connected, through a via V35, to a plate electrode PL3 arranged in dielectric layer LY2. Plate electrode PL3 is substantially in an L shape when multilayer body 110 is viewed in the plan view in the layering direction. Plate electrode PL3 has a first end connected to via V35. Plate electrode PL3 has a second end connected to output terminal T2 in side surface 114.

"Via V20" and "via V21" in FIG. 4 correspond to the "first electrode" in the first line and the "first electrode" in the second line in the present disclosure, respectively. A portion in side surface 114 of "ground terminal GND" to which plate electrode PL1 is connected corresponds to the "second electrode" in the first line. A portion in side surface 113 of "ground terminal GND" to which plate electrode PL2 is connected corresponds to the "second electrode" in the second line.

In a filter apparatus including a plurality of resonators, with the higher degree of magnetic coupling between the resonators, the attenuation pole generated by the resonators can be closer to the pass band to thereby increase steepness of attenuation at an end of the pass band. With the higher degree of magnetic coupling, on the other hand, an amount of attenuation at the attenuation pole is smaller and a desired amount of attenuation may not be achieved in a non-pass band. Therefore, depending on specifications required of the filter apparatus, the configuration in which the resonators are connected by a common plate electrode may not be able to achieve desired filter characteristics.

Then, in the first example embodiment, for a filter apparatus including resonators configured in three stages, such a configuration is adopted in which the inductor path in the resonator in the second stage includes two lines and the two lines are connected to each other at a position different from positions of connection of the resonator in the first stage and the resonator in the third stage in the respective lines. Since the path from the resonator in the first stage to the resonator in the third stage is thus longer than in an example where the three resonators are connected to one another by a common electrode, the degree of magnetic coupling between the resonator in the first stage and the resonator in the third stage can selectively be weakened.

Figure 5:
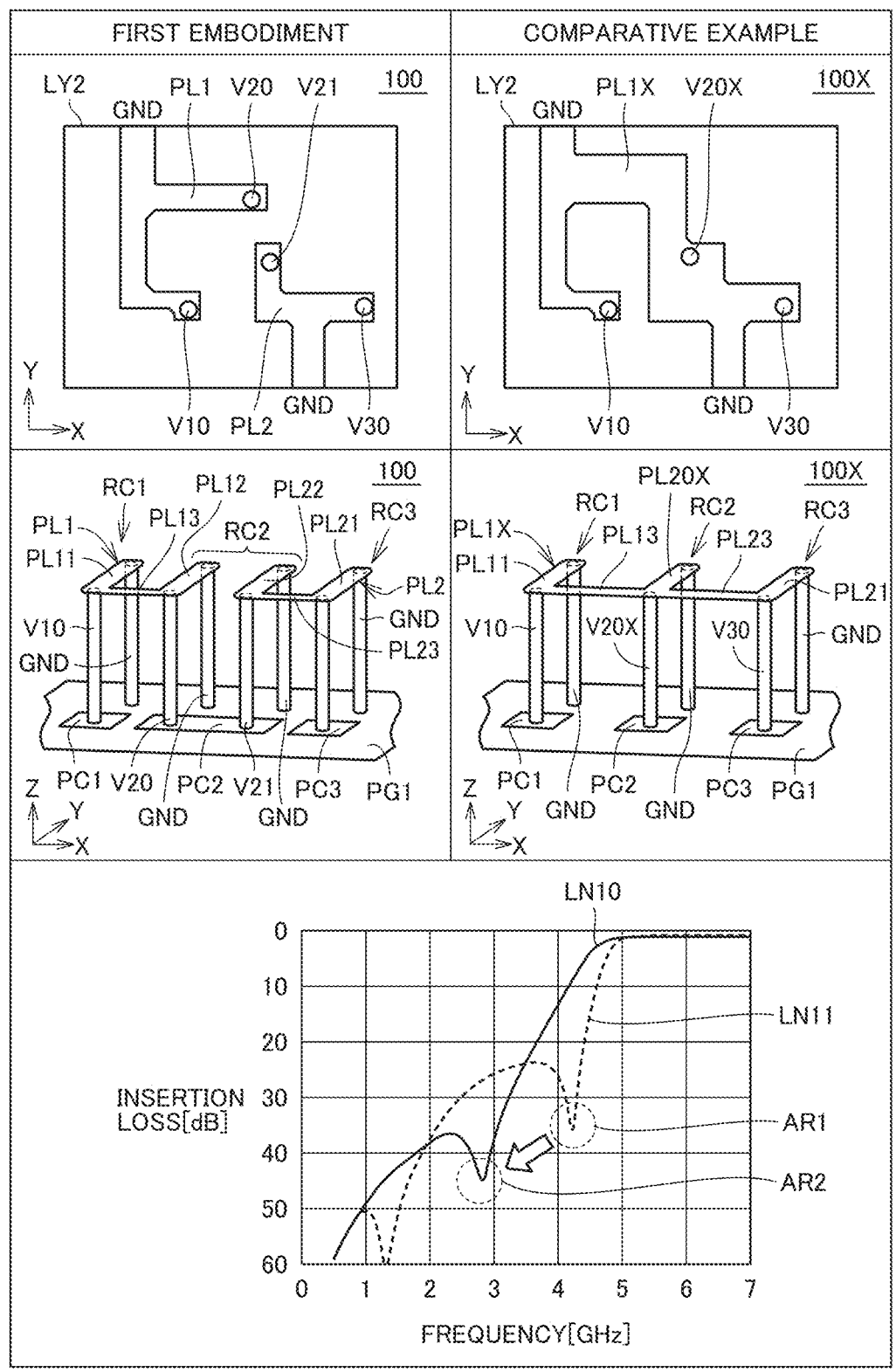
FIG. 5 is a diagram for illustrating filter characteristics of filter apparatuses in the first example embodiment of the present invention and a comparative example.

FIG. 5 is a diagram for illustrating filter characteristics of filter apparatus 100 in the first example embodiment and a filter apparatus 100X in a comparative example. FIG. 5 shows in an upper tier, exemplary arrangement of electrodes in dielectric layer LY2 in the filter apparatuses in the first example embodiment and the comparative example. FIG. 5 shows in a middle tier, a schematic configuration diagram (model diagram) showing each filter apparatus in a simplified manner. FIG. 5 shows in a lower tier, an insertion loss in each filter apparatus. In the lower tier in FIG. 5, a solid line LN10 represents characteristics in the case of filter apparatus 100 and a dashed line LN11 represents characteristics in the case of filter apparatus 100X.

In the model diagram shown in FIG. 5 and FIGS. 6 to 13 which will be described later, ground terminals GND arranged in side surfaces 113 and 114 in FIG. 4 are each expressed in a form of a via. For the sake of facilitation of description, each resonator is shown in a configuration in which a via connected to a capacitor electrode, a via corresponding to ground terminal GND, and a plate electrode that connects these vias to each other are combined. Though the model diagram shows that each resonator is formed from an individual via and an individual plate electrode and the resonators are connected to each other by an individual plate electrode, in an actual structure, as shown in FIG. 4, ground terminal GND and/or a portion of the plate electrode may be common between two resonators.

Referring to FIG. 5, in filter apparatus 100X in the comparative example, capacitor electrode PC2 of resonator RC2 is connected to a plate electrode PL1X in dielectric layer LY2 through one via V20X. Plate electrode PL1X is shared among resonators RC1 to RC3, and via V10 in resonator RC1 and via V30 in resonator RC3 in addition to via V20X in resonator RC2 are also connected to plate electrode PL1X. In other words, the resonators are connected to one another by plate electrode PL1X. In the schematic configuration diagram in the middle tier, an interconnection pattern PL13 and an interconnection pattern PL23 are connected at the same position in a plate electrode PL20X, interconnection pattern PL13 connecting plate electrode PL11 of resonator RC1 and plate electrode PL20X of resonator RC2 to each other, interconnection pattern PL23 connecting plate electrode PL20X of resonator RC2 and a plate electrode PL21 of resonator RC3 to each other. Therefore, a line length from resonator RC1 to resonator RC3 is the sum of interconnection pattern PL13 and interconnection pattern PL23.

In filter apparatus 100 in the first example embodiment, on the other hand, plate electrodes PL1 and PL2 separate from each other are connected to resonator RC2 through respective vias V20 and V21. Therefore, in the schematic configuration diagram in the middle tier, the line length from resonator RC1 to resonator RC3 is the sum of vias V20 and V21 and a distance between via V20 and via V21 in capacitor electrode PC2 in addition to interconnection patterns PL13 and PL23. Since the line length over which resonator RC1 and resonator RC3 are connected to each other in filter apparatus 100 is thus longer than the line length in filter apparatus 100X, the degree of magnetic coupling between resonator RC1 and resonator RC3 in filter apparatus 100 is weaker than in filter apparatus 100X.

In the exemplary configuration of filter apparatus 100 including three resonators, magnetic coupling between resonator RC1 and resonator RC3 may generate the attenuation pole closest to the pass band, for example, on a lower frequency side of the pass band. With the higher degree of magnetic coupling between resonator RC1 and resonator RC3, a frequency at which the attenuation pole is generated is closer to the pass band, and hence attenuation at the end on the lower frequency side of the pass band becomes steep, whereas an amount of attenuation at the attenuation pole decreases (an area AR1 in the lower tier in FIG. 5). Therefore, as shown with dashed line LN11 in the lower tier in FIG. 5, a region where the insertion loss is not higher than about 30 dB is produced also in a non-pass band not higher than about 3.0 GHz and requested attenuation characteristics may not be met, for example.

In contrast, when the degree of magnetic coupling between resonator RC1 and resonator RC3 becomes weaker, a frequency at which the attenuation pole is generated becomes lower. Then, steepness at the end on the lower frequency side of the pass band is relatively relaxed, whereas the amount of attenuation at the attenuation pole increases (an area AR2 in the lower tier in FIG. 5). Therefore, the insertion loss not lower than about 30 dB can be achieved also in the non-pass band not higher than about 3.0 GHz, for example.

As set forth above, the inductor of resonator RC2 in the second stage includes the two lines and the position(s) of connection to resonator RC1 in the first stage and/or resonator RC3 in the third stage is/are different from the position of connection between the two lines as in filter apparatus 100 in the first example embodiment. Thus, the degree of magnetic coupling between resonator RC1 and resonator RC3 is weakened while maintaining the degree of magnetic coupling between resonator RC1 and resonator RC2 and magnetic coupling between resonator RC2 and resonator RC3 high, and desired attenuation characteristics can be achieved.

In general, steepness and the amount of attenuation which are the attenuation characteristics are in trade-off relation with the degree of magnetic coupling. Therefore, desired attenuation characteristics can be achieved by changing the position of the interconnection pattern that connects the resonators to each other depending on requested specifications to adjust the relative degree of coupling between the resonators.

Modification

A modification of a state of connection between resonators in a filter apparatus will be described with reference to FIGS. 6 to 13 below. FIGS. 6 to 13 each show a schematic configuration diagram (model diagram) of the resonator included in the filter apparatus as described above.

First Modification

Figure 6:
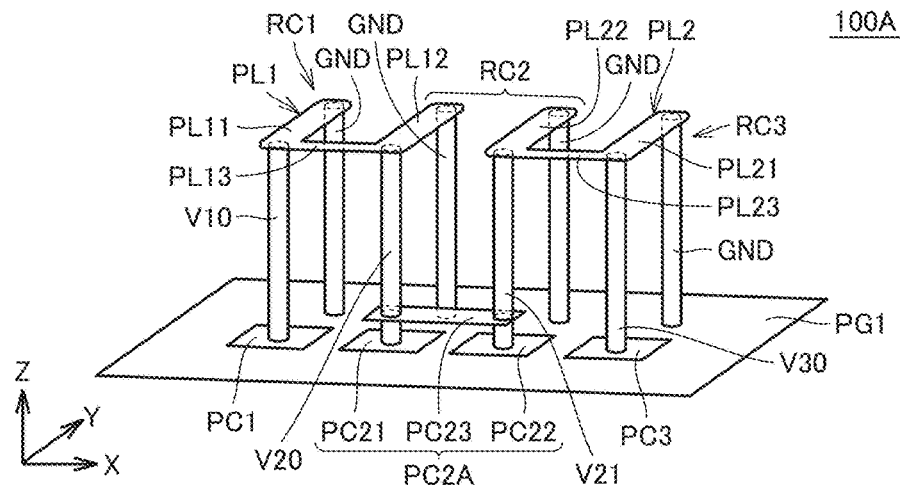
FIG. 6 is a schematic configuration diagram of a filter apparatus in a first modification of an example embodiment of the present invention.

A first modification of an example embodiment of the present disclosure illustrates another exemplary configuration of a capacitor electrode in resonator RC2. FIG. 6 is a schematic configuration diagram of a filter apparatus 100A in the first modification.

Referring to FIG. 6, filter apparatus 100A is configured such that capacitor electrode PC2 of resonator RC2 in filter apparatus 100 in FIG. 5 is replaced with a capacitor electrode PC2A. Description of elements in FIG. 6 the same as those in the model diagram of filter apparatus 100 shown in FIG. 5 will not be repeated.

Capacitor electrode PC2 in filter apparatus 100 includes a single plate electrode opposed to ground electrode PG1. Capacitor electrode PC2A in filter apparatus 100A in the first modification, on the other hand, includes a plurality of plate electrodes PC21, PC22, and PC23.

More specifically, vias V20 and V21 have lower ends connected to plate electrodes PC21 and PC22 opposed to ground electrode PG1, respectively. At a position which is closer to upper surface 111 than the ends of vias V20 and V21 and is proximate to plate electrodes PC21 and PC22, via V20 and via V21 are connected to each other by plate electrode PC23. An area where plate electrodes PC21 and PC22 are opposed to ground electrode PG1 is set to be approximately as large as an area where capacitor electrode PC2 is opposed to ground electrode PG1 in filter apparatus 100.

According to such a configuration, capacitor electrode PC2A including plate electrodes PC21, PC22, and PC23 functions similarly to capacitor electrode PC2 in filter apparatus 100. The position of connection between the two lines of the inductor path in resonator RC2 is different from the position of connection of resonator RC1 or RC3 to resonator RC2 in filter apparatus 100A, so that the degree of magnetic coupling between resonator RC1 and resonator RC3 can be weaker than in filter apparatus 100X in the comparative example in FIG. 5, and hence desired attenuation characteristics can be achieved.

In the first modification, capacitor electrode PC2A corresponds to the "capacitor electrode" and the "second interconnection pattern" of the second resonator in the present disclosure.

Second Modification

A second modification of an example embodiment of the present disclosure illustrates a configuration in which the two lines of the inductor path in resonator RC2 are connected to each other by yet another plate electrode in addition to capacitor electrode PC2.

Figure 7:
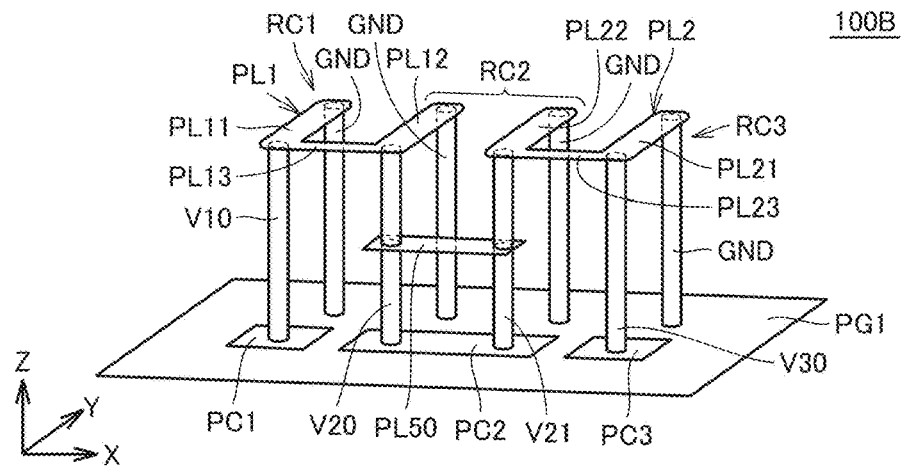
FIG. 7 is a schematic configuration diagram of a filter apparatus in a second modification of an example embodiment of the present invention.

FIG. 7 is a schematic configuration diagram of a filter apparatus 100B in the second modification. Filter apparatus 100B is provided with an interconnection pattern PL50 that connects vias V20 and V21 of resonator RC2 to each other, in addition to the configuration of filter apparatus 100 in the first example embodiment. Interconnection pattern PL50 is connected to vias V20 and V21 in a dielectric layer between the dielectric layer where plate electrodes PL1 and PL2 are arranged and the dielectric layer where capacitor electrode PC2 is arranged.

In such a configuration, a distance over which resonator RC1 and resonator RC3 are connected to each other is slightly less than in filter apparatus 100 in the first example embodiment. In other words, the degree of magnetic coupling between resonator RC1 and resonator RC3 is intermediate between the degree of coupling in filter apparatus 100 and the degree of coupling in filter apparatus 100X in the comparative example. Therefore, the degree of magnetic coupling between resonator RC1 and resonator RC3 can be adjusted by adjustment of the position of interconnection pattern PL50.

Though an example in which via V20 and via V21 are connected to each other by interconnection pattern PL50 in filter apparatus 100B is shown, ground terminals GND arranged on the side surface may be connected to each other by interconnection pattern PL50.

Third Modification

A third modification of an example embodiment of the present disclosure illustrates a configuration in which branching to the two lines of the inductor path in resonator RC2 is made at a position different from capacitor electrode PC2.

Figure 8:
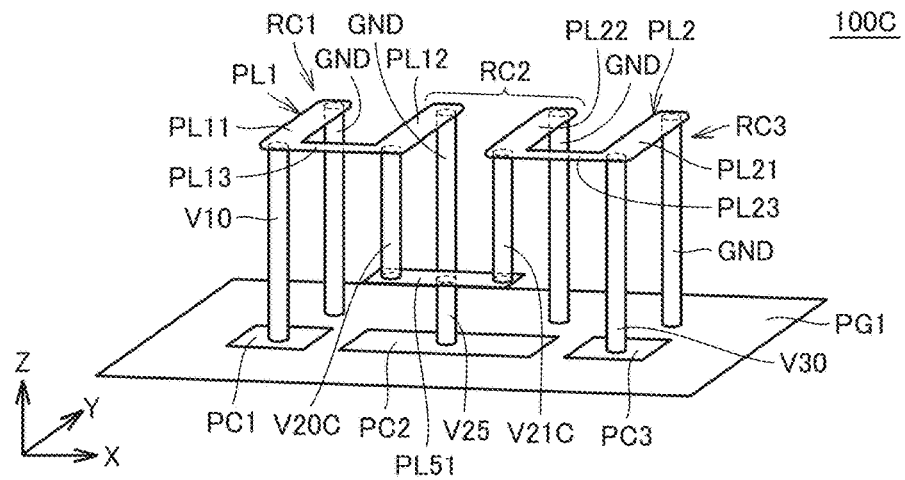
FIG. 8 is a schematic configuration diagram of a filter apparatus in a third modification of an example embodiment of the present invention.

FIG. 8 is a schematic configuration diagram of a filter apparatus 100C in the third modification. In filter apparatus 100C, a portion of connection between plate electrodes PL1 and PL2 and capacitor electrode PC2 is defined by vias V20C, V21C and V25 and an interconnection pattern PL51.

More specifically, interconnection pattern PL51 is arranged in a dielectric layer above capacitor electrode PC2, and connected to capacitor electrode PC2 through via V25. Plate electrode PL1 and interconnection pattern PL51 are connected to each other through via V20C, and plate electrode PL2 and interconnection pattern PL51 are connected to each other through via V21C. In other words, a portion of paths from plate electrodes PL1 and PL2 to capacitor electrode PC2 is shared between the two lines of the inductor path in resonator RC2.

According to such a configuration as well, as in the second modification, a distance over which resonator RC1 and resonator RC3 are connected to each other is slightly less than in filter apparatus 100 in the first example embodiment. Therefore, the degree of magnetic coupling between resonator RC1 and resonator RC3 can be weaker than in filter apparatus 100 and the comparative example. Therefore, the degree of magnetic coupling between resonator RC1 and resonator RC3 can be adjusted by adjustment of the position of interconnection pattern PL51.

"Interconnection pattern PL51" in the third modification corresponds to the "second interconnection pattern" in the present disclosure. "Via V25" in the third modification corresponds to the "third electrode" in the present disclosure.

Fourth Modification

In the first example embodiment and the first to third modifications, resonator RC1 and resonator RC2 are connected to each other through interconnection pattern PL13 in plate electrode PL1 arranged in the dielectric layer on the side of upper surface 111, and resonator RC2 and resonator RC3 are connected to each other through interconnection pattern PL23 in plate electrode PL2 arranged in the dielectric layer on the side of upper surface 111. A fourth modification of an example embodiment of the present disclosure illustrates a configuration in which resonator RC1 and resonator RC2 are connected to each other and resonator RC2 and resonator RC3 are connected to each other at positions different from the plate electrodes on the upper surface side.

Figure 9:
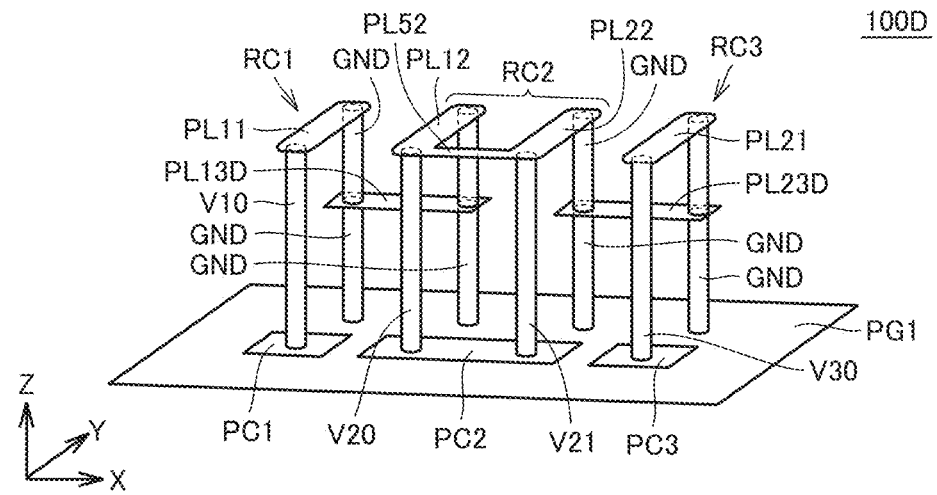
FIG. 9 is a schematic configuration diagram of a filter apparatus in a fourth modification of an example embodiment of the present invention.

FIG. 9 is a schematic configuration diagram of a filter apparatus 100D in the fourth modification. In filter apparatus 100D, an interconnection pattern PL13D connecting resonator RC1 and resonator RC2 to each other connects two ground terminals GND. One of ground terminals GND connects plate electrode PL11 and ground electrode PG1 to each other, and the other ground terminal GND connects plate electrode PL12 and ground electrode PG1 to each other. Similarly, an interconnection pattern PL23D connecting resonator RC2 and resonator RC3 to each other connects two ground terminals GND. One of ground terminals GND connects plate electrode PL21 and ground electrode PG1 to each other, and the other ground terminal GND connects plate electrode PL22 and ground electrode PG1 to each other. When a portion or the entirety of ground terminal GND is shared between resonators, an electrode corresponding to interconnection pattern PL13D or PL23D may not substantially be arranged.

In the example in FIG. 9, connection between the two lines of the inductor path in resonator RC2 is made by an interconnection pattern PL52 that connects plate electrode PL12 and plate electrode PL22 to each other. A position where interconnection pattern PL52 is arranged is not limited to the position in FIG. 9, and interconnection pattern PL52 may be arranged at any position so long as the position is different from the position of interconnection pattern PL13D or PL23D. Capacitor electrode PC2 may be used as interconnection pattern PL52 as in the first example embodiment.

According to such a configuration as well, a distance over which resonator RC1 and resonator RC3 are connected to each other is longer than in filter apparatus 100X in the comparative example. Therefore, since the degree of magnetic coupling between resonator RC1 and resonator RC3 can be weaker than in filter apparatus 100X in the comparative example in FIG. 5, desired attenuation characteristics can be achieved.

Interconnection pattern PL13D may be configured to connect via V10 and via V20 to each other, and interconnection pattern PL23D may be configured to connect via V21 and via V30 to each other.

"Interconnection pattern PL13D," "interconnection pattern PL52," and "interconnection pattern PL23D" in the fourth modification correspond to the "first interconnection pattern," the "second interconnection pattern," and the "third interconnection pattern" in the present disclosure, respectively.

Fifth Modification

The filter apparatuses in the first example embodiment and the first to fourth modifications described above are configured such that, by the interconnection pattern that connects the resonators to each other, the vias connected to the capacitor electrode are connected to each other or the ground terminals are connected to each other. A fifth modification of an example embodiment of the present disclosure illustrates a configuration in which the via connected to the capacitor electrode and the ground terminal are connected to each other by the interconnection pattern that connects the resonators to each other.

Figure 10:
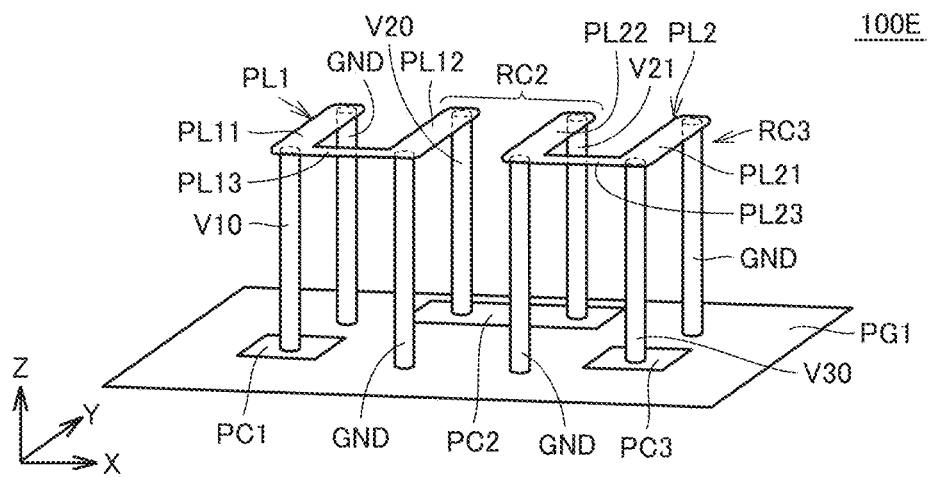
FIG. 10 is a schematic configuration diagram of a filter apparatus in a fifth modification of an example embodiment of the present invention.

FIG. 10 is a schematic configuration diagram of a filter apparatus 100E in the fifth modification. In filter apparatus 100E, arrangement in the Y-axis direction of the inductor path in resonator RC2 is reverse to arrangement in filter apparatus 100 in the first example embodiment. Vias V20 and V21 connected to capacitor electrode PC2 are arranged in the positive direction along the Y axis relative to ground terminal GND. Via V10 of resonator RC1 and ground terminal GND of the first line of resonator RC2 are connected to each other by interconnection pattern PL13 connecting resonator RC1 and resonator RC2 to each other. Similarly, via V30 of resonator RC3 and ground terminal GND of the second line of resonator RC2 are connected to each other by interconnection pattern PL23 connecting resonator RC2 and resonator RC3 to each other. The first line and the second line of resonator RC2 are connected to each other by capacitor electrode PC2.

According to such a configuration as well, a distance over which resonator RC1 and resonator RC3 are connected to each other is longer than in filter apparatus 100X in the comparative example. Therefore, since the degree of magnetic coupling between resonator RC1 and resonator RC3 can be weaker than in filter apparatus 100X in the comparative example in FIG. 5, desired attenuation characteristics can be achieved.

Arrangement of resonator RC2 in FIG. 10 is by way of example for facilitation of description, and the arrangement is not limited as such so long as a similar connection configuration can be achieved. For example, in the arrangement of filter apparatus 100 in the first example embodiment, interconnection pattern PL13 may be configured to connect via V10 of resonator RC1 and ground terminal GND of resonator RC2 to each other. Alternatively, interconnection pattern PL13 may be configured to connect ground terminal GND of resonator RC1 and via V20 of resonator RC2 to each other.

Sixth Modification

A sixth modification of an example embodiment of the present disclosure illustrates a configuration in which a manner of connection between resonator RC1 and resonator RC2 is different from a manner of connection between resonator RC2 and resonator RC3.

Figure 11:
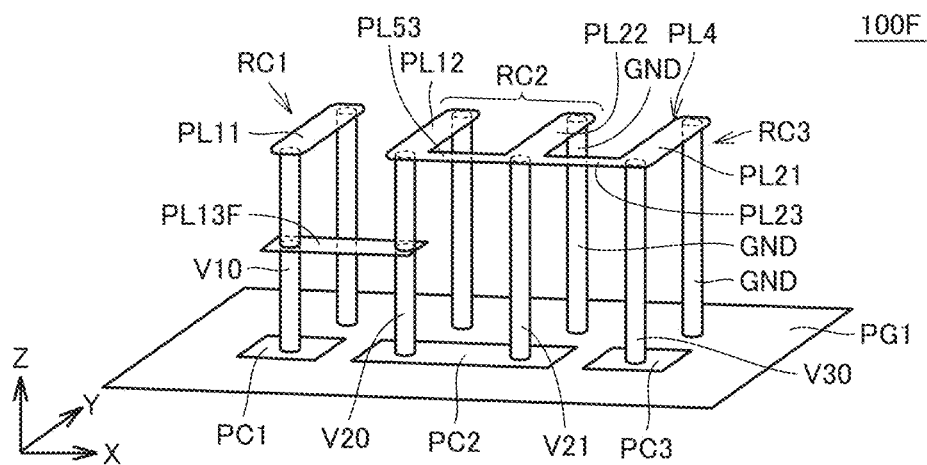
FIG. 11 is a schematic configuration diagram of a filter apparatus in a sixth modification of an example embodiment of the present invention.

FIG. 11 is a schematic configuration diagram of a filter apparatus 100F in the sixth modification. In filter apparatus 100F, an interconnection pattern PL53 connecting the two lines of resonator RC2 to each other and interconnection pattern PL23 connecting resonator RC2 and resonator RC3 to each other are connected at the same position in plate electrode PL22 of resonator RC2. An interconnection pattern PL13F connecting resonator RC1 and resonator RC2 to each other, on the other hand, connects vias V10 and via V20 to each other in a dielectric layer below interconnection pattern PL53. According to such a configuration as well, since the degree of magnetic coupling between resonator RC1 and resonator RC3 can be weaker than in filter apparatus 100X in the comparative example, attenuation characteristics in the non-pass band can be improved.

Though the interconnection pattern connecting resonator RC1 and resonator RC2 to each other is connected to resonator RC2 at a position different from interconnection pattern PL53 in the example in FIG. 11, alternatively, interconnection pattern PL23 connecting resonator RC2 and resonator RC3 to each other may be configured to be connected to resonator RC2 at a position different from interconnection pattern PL53.

"Interconnection pattern PL13F," "interconnection pattern PL53," and "interconnection pattern PL23" in the sixth modification correspond to the "first interconnection pattern," the "second interconnection pattern," and the "third interconnection pattern" in the present disclosure, respectively.

Seventh Modification

The filter apparatus described in each of the first example embodiment and the first to sixth modifications is configured such that at least one of the interconnection pattern connecting the resonators to each other and the interconnection pattern connecting the two lines of resonator RC2 to each other is arranged in a different dielectric layer. A seventh modification of an example embodiment of the present disclosure illustrates a configuration in which these interconnection patterns are arranged in the same dielectric layer.

Figure 12:
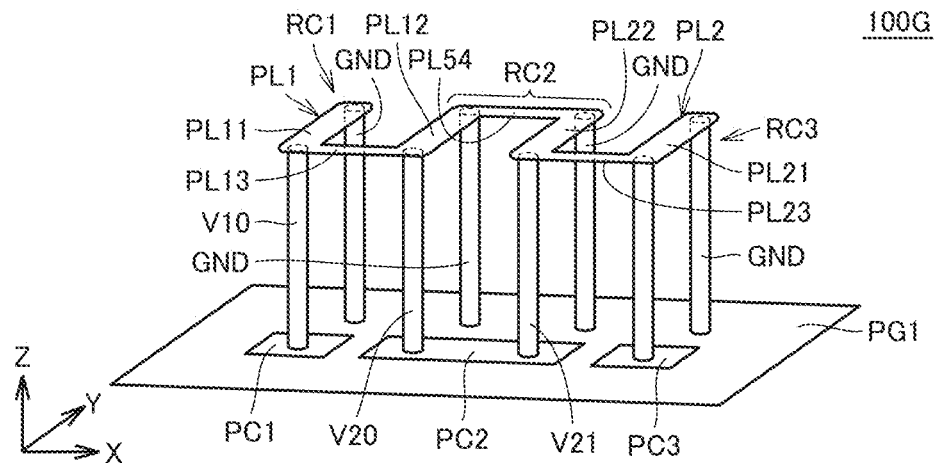
FIG. 12 is a schematic configuration diagram of a filter apparatus in a first example of a seventh modification of an example embodiment of the present invention.
Figure 13:
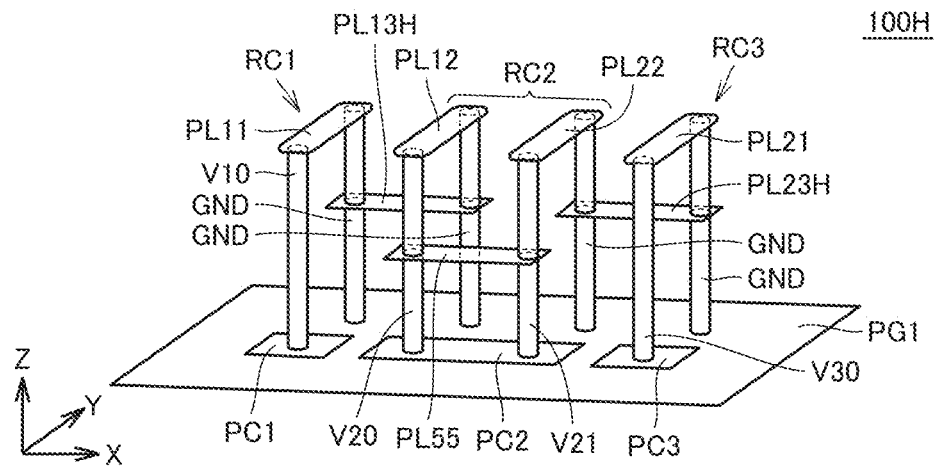
FIG. 13 is a schematic configuration diagram of a filter apparatus in a second example of the seventh modification of an example embodiment of the present invention.

FIG. 12 is a schematic configuration diagram of a filter apparatus 100G in a first example of the seventh modification. FIG. 13 is a schematic configuration diagram of a filter apparatus 100H in a second example of the seventh modification.

In filter apparatus 100G in FIG. 12, interconnection pattern PL13 connecting resonator RC1 and resonator RC2 to each other, interconnection pattern PL23 connecting resonator RC2 and resonator RC3 to each other, and an interconnection pattern PL54 connecting the two lines of resonator RC2 to each other are arranged in the same dielectric layer where plate electrodes PL11, PL12, PL21, and PL22 of the resonators are arranged, as in filter apparatus 100X in the comparative example. In filter apparatus 100G, however, interconnection patterns PL13 and PL23 are connected to resonator RC2 through via V20 and via V21, respectively, whereas interconnection pattern PL54 connecting the two lines of resonator RC2 to each other connects ground terminals GND in the two lines to each other. In other words, interconnection pattern PL13 is connected to interconnection pattern PL54 at a different position on plate electrode PL12 of resonator RC2, and interconnection pattern PL23 is connected to interconnection pattern PL54 at a different position on plate electrode PL22 of resonator RC2.

In filter apparatus 100H in FIG. 13, an interconnection pattern PL13H connecting resonator RC1 and resonator RC2 to each other, an interconnection pattern PL23H connecting resonator RC2 and resonator RC3 to each other, and an interconnection pattern PL55 connecting the two lines of resonator RC2 to each other are arranged in the same dielectric layer below the dielectric layer where plate electrodes PL1l, PL12, PL21, and PL22 of the resonators are arranged. Interconnection pattern PL13H, however, connects ground terminals GND of the resonator to each other and interconnection pattern PL23H connects ground terminals GND of the resonator to each other, whereas interconnection pattern PL55 connects via V20 and V21 of resonator RC2 to each other.

In the configuration of any of filter apparatuses 100G and 100H as above, the degree of magnetic coupling between resonator RC1 and resonator RC3 is weaker than in filter apparatus 100X in the comparative example and hence attenuation characteristics can be improved.

In filter apparatus 100G, "interconnection pattern PL13," "interconnection pattern PL54," and "interconnection pattern PL23" correspond to the "first interconnection pattern," the "second interconnection pattern," and the "third interconnection pattern" in the present disclosure, respectively. In filter apparatus 100H, "interconnection pattern PL13H," "interconnection pattern PL55," and "interconnection pattern PL23H" correspond to the "first interconnection pattern," the "second interconnection pattern," and the "third interconnection pattern" in the present disclosure, respectively.

Second Example Embodiment

The first example embodiment and the first to seventh modifications above illustrate the configuration in which the filter apparatus includes the resonators in the three stages. The features of the present disclosure can be applied also to a filter apparatus including resonators in four or more stages.

Figure 14:
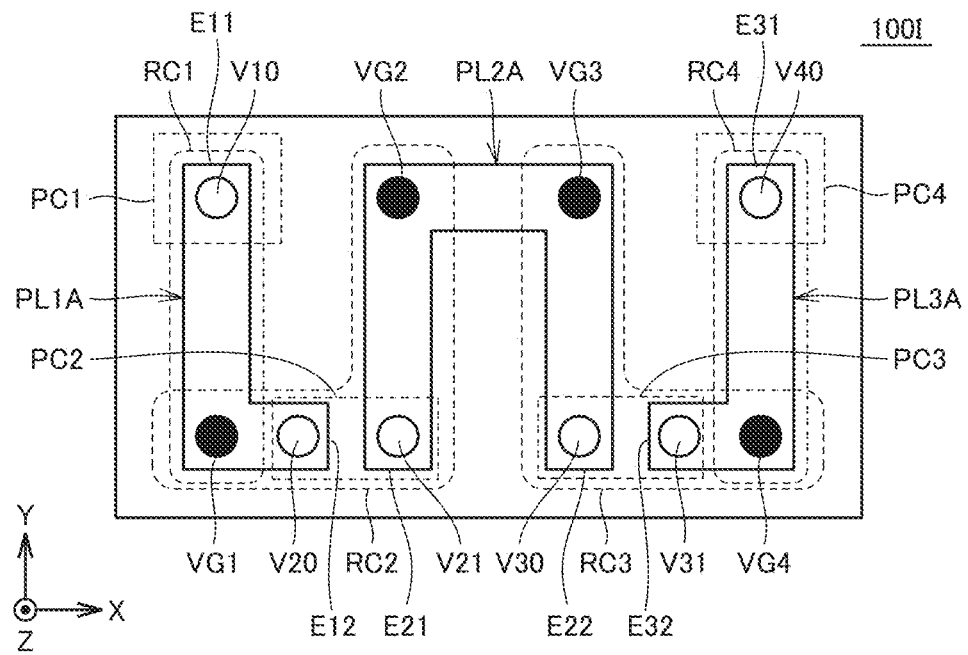
FIG. 14 is a plan view for illustrating arrangement of an interconnection pattern on an upper surface side in a filter apparatus in a second example embodiment of the present invention.

FIG. 14 is a plan view for illustrating arrangement of an interconnection pattern on an upper surface side in a filter apparatus 100I in a second example embodiment. For example, in the case of multilayer body 110 shown in FIG. 4, FIG. 14 is a plan view of dielectric layer LY2.

Referring to FIG. 14, in the dielectric layer, a band-shaped plate electrode PL2A substantially in a U shape is arranged between band-shaped plate electrodes PL1A and PL3A each substantially in an L shape.

Plate electrode PL1A substantially in the L shape has one end E11 connected to via V10 included in resonator RC1. Plate electrode PL1A has a bent portion connected to a ground via VG1. Plate electrode PL1A has the other end E12 connected to via V20 included in resonator RC2. In a dielectric layer in a lower portion of multilayer body 110, via V10 is connected to capacitor electrode PC1 that defines the capacitor together with ground electrode PG1, and ground electrode PG1 is connected to ground via VG1. Capacitor electrode PC2 that defines the capacitor together with ground electrode PG1 is connected to via V20.

One end E21 of plate electrode PL2A substantially in the U shape is arranged adjacently to end E12 of plate electrode PL1A and at a distance therefrom. Via V21 included in resonator RC2 is connected to end E21 of plate electrode PL2A. Via V21 is connected to capacitor electrode PC2.

Ground vias VG2 and VG3 are connected at two respective bent portions of plate electrode PL2A. Ground vias VG2 and VG3 are connected to ground electrode PG1. Via V30 included in resonator RC3 is connected to the other end E22 of plate electrode PL2A. Capacitor electrode PC3 included in the capacitor together with ground electrode PG1 is connected to via V30.

Plate electrode PL3A substantially in the L shape has one end E31 connected to a via V40 included in resonator RC4. Plate electrode PL3A has a bent portion connected to a ground via VG4. Plate electrode PL3A has the other end E32 connected to a via V31 included in resonator RC3. A capacitor electrode PC4 included in the capacitor together with ground electrode PG1 is connected to via V40, and ground electrode PG1 is connected to ground via VG4. Capacitor electrode PC3 is connected to via V31.

In such a configuration, resonator RC2 includes the first line and the second line as the inductor path. The first line extends from capacitor electrode PC2 through via V20, plate electrode PL1A, and ground via VG1 to ground electrode PG1 and the second line extends from capacitor electrode PC2 through via V21, plate electrode PL2A, and ground via VG2 to ground electrode PG1. Similarly, resonator RC3 includes the first line and the second line as the inductor path. The first line extends from capacitor electrode PC3 through via V30, plate electrode PL2A, and ground via VG3 to ground electrode PG1 and the second line extends from capacitor electrode PC3 through via V31, plate electrode PL3A, and ground via VG4 to ground electrode PG1.

Resonator RC1 is connected to the first line of resonator RC2 by plate electrode PL1A. The second line of resonator RC2 is connected to the first line of resonator RC3 by plate electrode PL2A. The second line of resonator RC3 is connected to resonator RC4 by plate electrode PL3A.

The path from resonator RC1 to resonator RC3 passes through vias V20 and V21 and capacitor electrode PC2. Therefore, the degree of magnetic coupling between resonator RC1 and resonator RC3 is weaker than in an example where plate electrode PL1A and plate electrode PL2A are directly connected to each other. Similarly, the path from resonator RC2 to resonator RC4 passes through vias V30 and V31 and capacitor electrode PC3. Therefore, the degree of magnetic coupling between resonator RC2 and resonator RC4 is weaker than in an example where plate electrode PL2A and plate electrode PL3A are directly connected to each other. In addition, the degree of coupling between resonator RC1 and resonator RC4 is also weaker than in an example where plate electrode PL1A, plate electrode PL2A, and plate electrode PL3A are directly connected to one another.

Therefore, as in the first example embodiment, the amount of attenuation at the attenuation pole caused by magnetic coupling between resonator RC1 and resonator RC3, magnetic coupling between resonator RC2 and resonator RC4, and magnetic coupling between resonator RC1 and resonator RC4 can be increased.

The ground terminal arranged in the side surface of the multilayer body can also be used as the ground via in FIG. 14, as in the first example embodiment.

"Resonator RC1" to "resonator RC4" in the second example embodiment correspond to the "first resonator" to the "fourth resonator" in the present disclosure, respectively. In the second example embodiment, the line from via V20 through ground via VG1 to ground electrode PG1 corresponds to the "first line" in the present disclosure. In the second example embodiment, the line from via V21 through ground via VG2 to ground electrode PG1 corresponds to the "second line" in the present disclosure. In the second example embodiment, the line from via V31 through ground via VG4 to ground electrode PG1 corresponds to the "fourth line" in the present disclosure. In the second example embodiment, the line from via V30 through ground via VG3 to ground electrode PG1 corresponds to the "fifth line" in the present disclosure.

Eighth Modification

Figure 15:
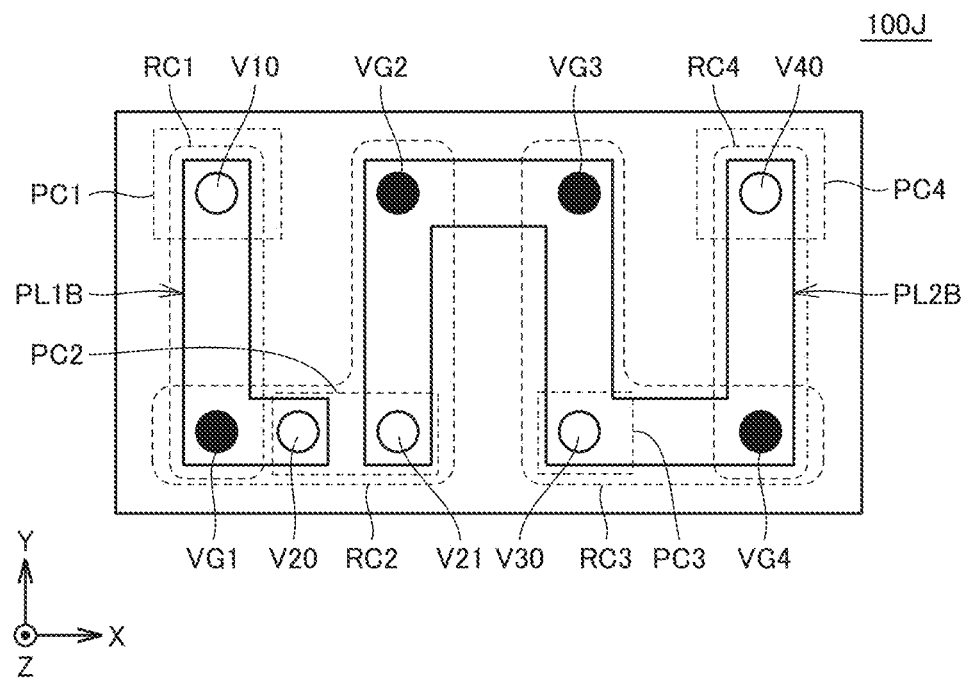
FIG. 15 is a plan view of a filter apparatus in an eighth modification of an example embodiment of the present invention.

FIG. 15 is a plan view of a filter apparatus 100J in an eighth modification of an example embodiment of the present disclosure. Filter apparatus 100J is configured such that plate electrode PL2A and plate electrode PL3A in filter apparatus 100I in the second example embodiment are connected to each other and there is a single via connected to capacitor electrode PC3 in resonator RC3. In other words, the filter apparatus is configured such that resonator RC2 and resonator RC4 are directly connected to each other by a common plate electrode PL2B to strengthen magnetic coupling between resonator RC2 and resonator RC4. In other words, filter apparatus 100J is configured such that the degree of magnetic coupling between resonator RC1 and resonator RC3 and magnetic coupling between resonator RC1 and resonator RC4 is weakened.

Therefore, in filter apparatus 100J, the amount of attenuation at the attenuation pole caused by magnetic coupling between resonator RC1 and resonator RC3 and magnetic coupling between resonator RC1 and resonator RC4 can be increased.

Ninth Modification

For the filter apparatuses in the second example embodiment and the eighth modification, an exemplary configuration is described in which all of four resonators are connected by an electrode and magnetically coupled to one another. A ninth modification of an example embodiment of the present disclosure illustrates a configuration of a filter apparatus including resonators in four stages, in which three resonators are magnetically coupled to one another and one remaining resonator is coupled by electromagnetic coupling.

Figure 16:
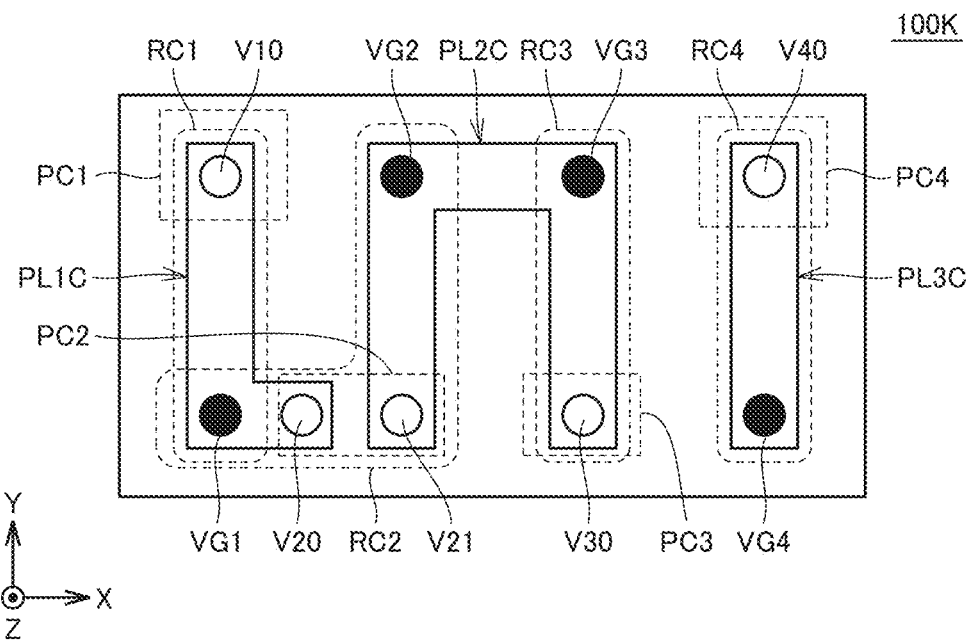
FIG. 16 is a plan view of a filter apparatus in a ninth modification of an example embodiment of the present invention.

FIG. 16 is a plan view of a filter apparatus 100K in the ninth modification. Filter apparatus 100K corresponds to a configuration in which resonator RC3 and resonator RC4 in filter apparatus 100I in the second example embodiment are not connected to each other and via V31 in resonator RC3 is removed. Resonator RC3 and resonator RC4 are thus no longer magnetically coupled to each other, and resonator RC3 and resonator RC4 are electromagnetically coupled to each other. Therefore, coupling between resonator RC4 and other resonators RC1 to RC3 becomes weaker.

Regarding resonators RC1 to RC3, resonator RC2 includes two lines including different vias extending from capacitor electrode PC2, and the two lines are connected to each other at a position different from a position of connection of resonator RC1 or resonator RC3 in each line, as in filter apparatus 100I in the second example embodiment. Therefore, the degree of magnetic coupling between resonator RC1 and resonator RC3 can be weakened.

The configuration of filter apparatus 100K is described in which resonator RC4 is electromagnetically coupled to remaining resonators RC1 to RC3. Alternatively, filter apparatus 100K may be configured such that resonator RC1 is electromagnetically coupled to remaining resonators RC2 to RC4.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:
a multilayer body including a plurality of dielectric layers;
an input terminal, an output terminal, and a ground terminal in the multilayer body;
a ground electrode connected to the ground terminal;
a first resonator, a second resonator, and a third resonator magnetically coupled to one another inside of the multilayer body and located in a signal transmission path from the input terminal to the output terminal;
each of the first resonator to the third resonator including:
a capacitor electrode opposed to the ground electrode and defining a capacitor together with the ground electrode; and
an inductor path that connects the capacitor electrode and the ground electrode to each other;

the inductor path in the second resonator including a first line and a second line electrically connected in parallel, between the capacitor electrode of the second resonator and the ground electrode;

a first interconnection pattern that connects the inductor path in the first resonator and the first line to each other;

a second interconnection pattern that connects the first line and the second line to each other; and a third interconnection pattern that connects the inductor path in the third resonator and the second line to each other; wherein the second interconnection pattern connects the first line and the second line to each other at a position different from a position of connection of the first interconnection pattern to the first line.

2. The filter apparatus according to claim 1, wherein the second interconnection pattern is the capacitor electrode of the second resonator.

3. The filter apparatus according to claim 1, wherein the second interconnection pattern connects the first line and the second line to each other at a position different from a position of connection of the third interconnection pattern to the second line.

4. The filter apparatus according to claim 3, wherein each of the first line and the second line includes:

a first electrode connected to the capacitor electrode of the second resonator;

a second electrode connected to the ground electrode; and a plate electrode that connects the first electrode and the second electrode to each other.

5. The filter apparatus according to claim 4, wherein
the first interconnection pattern is connected to the plate electrode of the first line;
the second interconnection pattern is connected to the first electrode of the first line and the first electrode of the second line; and
the third interconnection pattern is connected to the plate electrode of the second line.

6. The filter apparatus according to claim 4, wherein
the first interconnection pattern is connected to the first electrode of the first line;
the second interconnection pattern is connected to the plate electrode of the first line and the plate electrode of the second line; and
the third interconnection pattern is connected to the first electrode of the second line.

7. The filter apparatus according to claim 4, wherein
the second interconnection pattern is in or on a dielectric layer between the capacitor electrode of the second resonator and the plate electrode of the first line and the second line;
the filter apparatus further comprises a third electrode that connects the capacitor electrode of the second resonator and the second interconnection pattern to each other;
the first electrode of the first line is connected to the second interconnection pattern and the plate electrode of the first line; and
the second electrode of the first line is connected to the second interconnection pattern and the plate electrode of the second line.

8. The filter apparatus according to claim 7, wherein
the first interconnection pattern is connected to the first electrode of the first line; and
the third interconnection pattern is connected to the first electrode of the second line.

9. The filter apparatus according to claim 7, wherein
the first interconnection pattern is connected to the plate electrode of the first line; and
the third interconnection pattern is connected to the plate electrode of the second line.

10. The filter apparatus according to claim 1, further comprising a fourth resonator magnetically or electromagnetically coupled to the third resonator.

11. The filter apparatus according to claim 1, wherein the filter apparatus includes first, second and third stages magnetically coupled together.

12. The filter apparatus according to claim 11, wherein a path from a resonator in the first stage to a resonator in the third stage is longer than other paths between resonators in other stages.

13. The filter apparatus according to claim 11, wherein the inductor path in a resonator in the second stage includes two lines connected to each other at a position different from positions of connection of a resonator in the first stage and a resonator in the third stage.

14. The filter apparatus according to claim 1, wherein the filter apparatus is a band pass filter.

15. A filter apparatus comprising:

a multilayer body including a plurality of dielectric layers;

an input terminal, an output terminal, and a ground terminal in the multilayer body;

a ground electrode connected to the ground terminal;

a first resonator, a second resonator, a third resonator, and a fourth resonator magnetically coupled to one another inside of the multilayer body and located in a signal transmission path from the input terminal to the output terminal;

each of the first resonator to the fourth resonator including:

a capacitor electrode opposed to the ground electrode and defining a capacitor together with the ground electrode; and an inductor path that connects the capacitor electrode and the ground electrode to each other;

the inductor path in the second resonator including a first line and a second line electrically connected in parallel, between the capacitor electrode of the second resonator and the ground electrode;

the inductor path in the third resonator including a fourth line and a fifth line electrically connected in parallel, between the capacitor electrode of the third resonator and the ground electrode;

a first interconnection pattern that connects the inductor path in the first resonator and the first line to each other;

a second interconnection pattern that connects the first line and the second line to each other;

a third interconnection pattern that connects the second line and the fifth line to each other;

a fourth interconnection pattern that connects the inductor path in the fourth resonator and the fourth line to each other; and a fifth interconnection pattern that connects the fourth line and the fifth line to each other; wherein the second interconnection pattern connects the first line and the second line to each other at a position on the first line different from the first interconnection pattern; and the fifth interconnection pattern connects the fourth line and the fifth line to each other at a position on the fourth line different from the fourth interconnection pattern.

16. The filter apparatus according to claim 15, wherein the filter apparatus includes four or more stages magnetically coupled together.

17. The filter apparatus according to claim 15, wherein a path from the first resonator to the third resonator passes through first vias and the capacitor electrode of the second resonator.

18. The filter apparatus according to claim 17, wherein a path from the second resonator to the fourth resonator passes through second vias and another capacitor electrode.

19. The filter apparatus according to claim 15, wherein the second resonator and the fourth resonator are directly connected to each other by a common plate electrode.

20. The filter apparatus according to claim 15, wherein the first, second and third resonators are magnetically coupled to one another and the fourth resonator is coupled to the first, second, and third resonators by electromagnetic coupling.

* * * * *